United States Patent
Bollinger

(10) Patent No.: US 7,089,074 B2
(45) Date of Patent: Aug. 8, 2006

(54) HOST FEEDER SETUP VALIDATION

(75) Inventor: Peter Bollinger, Johnson City, NY (US)

(73) Assignee: Universal Instruments Corporation, Binghamton, NY (US)

( * ) Notice: Subject to any disclaimer, the term of this patent is extended or adjusted under 35 U.S.C. 154(b) by 0 days.

(21) Appl. No.: 10/985,279

(22) Filed: Nov. 10, 2004

(65) Prior Publication Data

US 2006/0100732 A1    May 11, 2006

(51) Int. Cl.
    *G06F 19/00* (2006.01)
(52) U.S. Cl. ............................... 700/117; 700/114
(58) Field of Classification Search ............... 700/114, 700/116, 117; 235/376; 29/740
    See application file for complete search history.

(56) References Cited

U.S. PATENT DOCUMENTS

| | | | |
|---|---|---|---|
| 5,235,164 A | 8/1993 | Noyama et al. | |
| 5,283,943 A | 2/1994 | Aguayo et al. | |
| 5,325,305 A * | 6/1994 | Rezaei | 700/114 |
| 5,400,497 A | 3/1995 | Watanabe et al. | |
| 5,553,376 A * | 9/1996 | Solanki et al. | 29/833 |
| 6,027,019 A | 2/2000 | Kou | |
| 6,530,517 B1 | 3/2003 | Kou | |
| 6,577,911 B1 * | 6/2003 | Lu | 700/96 |
| 6,778,878 B1 * | 8/2004 | Kou | 700/221 |
| 6,879,869 B1 * | 4/2005 | Kou | 700/117 |
| 6,918,730 B1 | 7/2005 | Kawai et al. | |
| 2003/0102367 A1 * | 6/2003 | Monette et al. | 235/376 |
| 2004/0080897 A1 | 4/2004 | Kodama et al. | |
| 2005/0161498 A1 * | 7/2005 | Byskov et al. | 235/376 |

* cited by examiner

*Primary Examiner*—Leo Picard
*Assistant Examiner*—Steven R. Garland
(74) *Attorney, Agent, or Firm*—Schmeiser, Olsen & Watts

(57) ABSTRACT

The present invention features a method and apparatus for feeder setup validation on a component placement machine. Provided are a host computer in communication with a feeder setup station operable with a feeder identifier for identifying a feeder and a component identifier for identifying a component in the feeder working in conjunction with a location to determine if a component stored in a feeder mounted in a location on the component placement machine is correct for a program corresponding to operation of a system for assembling component products.

7 Claims, 1 Drawing Sheet

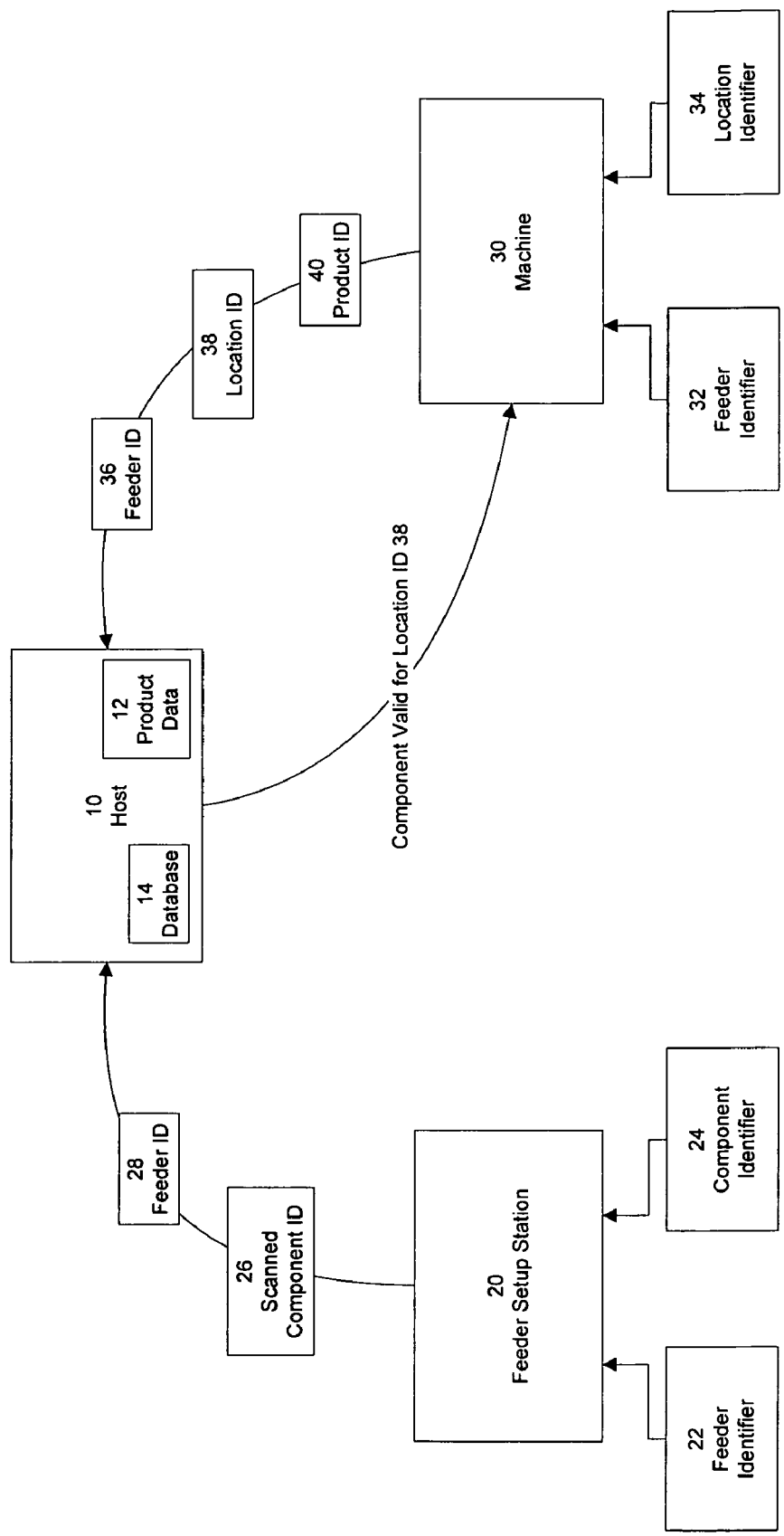

HOST FEEDER SETUP VALIDATION

BACKGROUND OF THE INVENTION

1. Technical Field

This invention relates to component placement machines and, more particularly, to the use of a host server to aid in operator feeder setup on the component placement machine.

2. Related Art

A component placement machine produces a printed circuit board (PCB) typically by picking components stored in various reels mounted on feeders mounted to various slots on the machine and then placing those components on the PCB. Many procedures exist to ensure the operator sets up a component placement machine correctly for production. Two known ways to accomplish this task include the following.

When a feeder does not contain any internal intelligence, the operator scans a label on the feeder or the reel upon which the components are stored. The label contains the identification (ID) of the particular component on that feeder/reel. After the operator scans the label, the machine stores the scanned component ID. The operator then mounts the feeder in the slot that they believe is the correct slot for the product the machine is or will be running. The machine then compares the ID of the scanned component with the ID of the component expected for that slot. If the component IDs are the same the operator has mounted the correct feeder/reel in the correct slot. This method is time consuming, in that the operator must scan each feeder in order to confirm that machine is setup correctly.

Another system employs the use of smart feeders. Smart feeders have the ability to store information about the components stored on the reels mounted on the feeder such as the component ID. Typically a memory chip is used and is programmed at an offline setup station. Again the operator mounts the feeder in the particular slot on the machine which they believe is the correct slot for receiving the particular component. The machine then reads the memory chip to determine the component ID and compares that ID with ID expected for that slot. If the IDs are correct, the operator mounted the feeder correctly. This method is expensive due to the fact that each feeder must contain means to store the component ID and the machine must be capable of reading those means.

A need exists for a method that overcomes at least one of the aforementioned, and other, deficiencies in the art.

SUMMARY OF THE INVENTION

The present invention provides a method to improve the time that is required for an operator to setup feeders on a component placement machine by providing an interface between a host computer, a feeder setup station and the component placement machine.

In a first general aspect, the present invention provides a system for assembling multiple component products, comprising:
   a host computer;
   a feeder setup station, in communication with said host computer;
   a component identifier, operable with said feeder setup station, for identifying a component stored in at least one feeder;
   a first feeder identifier, operable with said feeder setup station, for identifying said at least one feeder when said at least one feeder is mounted at said feeder setup station after said component has been identified;
   a component placement machine, in communication with said host computer, further including a program containing one or more specified components with corresponding specified locations;
   a second feeder identifier, operable with said component placement machine, for identifying said at least one feeder when said at least one feeder is mounted at said component placement machine; and
   a location identifier, operable with said component placement machine, for identifying a location on said component placement machine in which said at least one feeder corresponding to said second feeder identifier is mounted.

In a second general aspect of the present invention provides a method for assembling multiple component products, comprising:
   providing a host computer;
   providing a feeder setup station, in communication with said host computer, wherein said feeder setup station includes a first feeder identifier for identifying at least one feeder and a component identifier for identify a component in said at least one feeder;
   providing a component placement machine, in communication with said host computer, wherein said component placement machine includes a program containing one or more specified components with corresponding specified locations, and a second feeder identifier for identifying said at least one feeder, and a location identifier for identifying a location;
   enabling said component placement machine when said component as identified by said component identifier matches said specified component of said program as indicated by said location identified by said location identifier to determine if said component stored in said at least one feeder mounted in said location on said component placement machine is correct for said program.

BRIEF DESCRIPTION OF THE DRAWINGS

A complete understanding of the present invention may be obtained by reference to the accompanying drawings, when considered in conjunction with the subsequent detailed description, in which:

The FIGURE depicts a schematic view of a host feeder setup validation, in accordance with the present invention.

DETAILED DESCRIPTION OF THE INVENTION

Although certain embodiment of the present invention will be shown and described in detail, it should be understood that various changes and modification may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

A component placement machine typically uses a program within the machine for picking components stored in feeders mounted in slots within the machine and then placing them on a printed circuit board (PCB) that is transferred in and out of the machine. The program contains the identification (ID) of the various components, which slots contain the feeders storing those IDs, and the locations upon which to place those IDs onto the PCB. It is desirable to have a low cost solution for a feeder setup validation system, that confirms that the operator mounted the correct feeder with the correct component ID in the correct slot both before the machine begins picking and placing components, as well as, during the running of the program. The present invention accomplishes this by providing a feeder which stores within itself a minimal amount of information that the machine can easily read; a feeder setup station; and, a host computer that interfaces with the machine and the feeder setup station.

FIG. 1 depicts a schematic view of the present invention. The system 100 comprises a host computer 10, a feeder setup station 20, and a component placement machine 30. The host computer 10 is able to communicate with feeder setup station 20 and with component placement machine 30. Host computer 10 comprises product data 12 and a database 14. Feeder setup station 20 comprises a feeder identifier 22 and a component identifier 24. Component placement machine 30 comprises a feeder identifier 32 and location identifier 34.

During the setup of a feeder (not shown) at feeder setup station 20, the operator scans the label on the reel of components mounted on the feeder. The component identifier 24 of feeder setup station 20 receives the scanned label and determines scanned component ID 26. The operator then mounts the feeder into a slot on the feeder setup station 20. The feeder identifier 22 of feeder setup station 20 determines the feeder ID 28 of the just mounted feeder. The feeder setup station 20 passes to the host computer 10 the feeder ID 28 and the scanned component ID 26 of the just mounted feeder. Host computer 10 associates the feeder ID 28 with the scanned component ID 26 and stores this association information into a database 14.

At any time later an operator mounts this same feeder into a slot on a component placement machine 30. The feeder identifier 32 of component placement machine 30 determines the feeder ID 36 and the location identifier 34 determines the location ID 38 of the slot of the just mounted feeder. The machine passes the feeder ID 36, the location ID 38, and the product ID 40 of the current program to the host computer 10. The host computer 10 uses the product ID 40 and the location ID 38 to determine in product data 12 the identification of the expected component for location ID 38. The host computer 10 uses the feeder ID 36 to lookup in the database 14 the scanned component ID 26 associated with feeder ID 36 and compares it with the expected component for location ID 38. If the identification of the components is the same, the operator mounted the feeder in the correct slot on the component placement machine 30 and host computer 10 informs component placement machine 30 that location ID 38 contains a valid component. Amongst other advantages, setting up the feeder at feeder setup station 20 minimizes the time the operator must spend setting up the component placement machine 30 and by using a host computer 10 the amount of information that the feeder itself must store is minimized.

The time savings in presetting up the feeders is even more evident when a plurality of feeders are mounted on a feeder cart that can move between feeder setup station 20 and component placement machine 30. In this case, while component placement machine 30 is running a first program using a first feeder cart, an operator can be mounting feeders for a second program at feeder setup station 20 on to a second feeder cart. When it comes time to run the second program, the operator removes the first feeder cart from component placement machine 30 and mounts the second feeder cart. The component placement machine 30 then passes for each feeder mounted on the second feeder cart the feeder ID 36 and location ID 38 to the host computer 10. In this case, the host computer confirms that the operator mounted the correct feeder containing the correct component in the correct slot on the second feeder cart at feeder setup station 20 host computer 10 informs component placement machine 30 that location ID 38 contains a valid component. This eliminates the scanning of each individual feeder after the operator mounts the second feeder cart on to component placement machine 30. Thereby greatly reducing the amount of time and effort, the operator takes to setup component placement machine 30 to run the second program.

The component placement machine 30 is then capable of running the program either by enabling the entire machine after validation of all the feeders or by enabling each feeder individually upon validation. In the later case, the component placement machine 30 may run the program, but is prohibited from picking from feeders that are not yet enabled.

Since other modification and changes varied to fit particular operating requirements and environments will be apparent to those skilled in the art, the invention is not considered limited to the example chosen for purposes of disclosure, and covers all changes and modification which do not constitute departures from the true spirit and scope of this invention.

What is claimed is:

1. A system for assembling multiple component products, comprising:
   a host computer;
   a feeder setup station, in communication with said host computer;
   a component identifier, operable with said feeder setup station, for identifying a component stored in at least one feeder;
   a first feeder identifier, operable with said feeder setup station, for identifying said at least one feeder when said at least one feeder is mounted at said feeder setup station after said component has been identified;
   a component placement machine, in communication with said host computer, further including a program containing one or more specified components with corresponding specified locations;
   a second feeder identifier, in communication and operable with said component placement machine, for identifying said at least one feeder when said at least one feeder is mounted at said component placement machine; and
   a location identifier, in communication and operable with said component placement machine, for identifying a location on said component placement machine in which said at least one feeder corresponding to said second feeder identifier is mounted.

2. The system of claim 1, wherein said host computer further comprises a database for storing identification of said component and identification of said at least one feeder, whereby said host computer will validate if said component stored in said at least one feeder mounted in said location on said component placement machine is correct for said program.

3. The system of claim 1, wherein said host computer further comprises a database for storing identification of said component and identification of said at least one feeder, whereby said host computer will determine if said component stored in said at least one feeder mounted in said location on said component placement machine is correct for said program.

4. The system of claim 1, further comprising a feeder cart adapted to carry said at least one feeder, wherein said feeder cart is interchangeably moveable between said feeder setup station and component placement machine.

5. A method for assembling multiple component products, comprising:
   providing a host computer;
   providing a feeder setup station, in communication with said host computer, wherein said feeder setup station includes a first feeder identifier for identifying at least one feeder and a component identifier for identifying a component in said at least one feeder;
   providing a component placement machine, in communication with said host computer, wherein said component placement machine includes a program containing one or more specified components with corresponding specified locations, and a second feeder identifier for identifying said at least one feeder, and a location identifier for identifying a location;
   enabling said component placement machine to pick said specified component from said corresponding location when said host computer informs said component placement machine that said component, as identified by said component identifier, in said feeder, as identified by said second feeder identifier, mounted in said location, as identified by said location identifier, matches said specified component for said corresponding location of said program.

6. The method of claim 5, wherein providing said host computer further comprises providing a database for storing identification of said at least one feeder and said component in said at least one feeder to compare with said program of said component placement to determine correct location of said at least one feeder.

7. The method of assembling multiple component parts of claim 5, wherein enabling said component placement machine occurs only when said host computer informs said component placement machine that all components, as identified by said component identifier, in all feeders, as identified by said second feeder identifier, mounted in all appropriate locations, as identified by said location identifier, match all specified components for corresponding locations of said program.

* * * * *